(12) United States Patent
Hsin

(10) Patent No.: US 10,096,660 B2
(45) Date of Patent: Oct. 9, 2018

(54) ARRAY SUBSTRATE, METHOD FOR MANUFACTURING ARRAY SUBSTRATE, AND DISPLAY DEVICE

(71) Applicant: BOE TECHNOLOGY GROUP CO., LTD., Beijing (CN)

(72) Inventor: Lungpao Hsin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/912,558

(22) PCT Filed: Aug. 11, 2015

(86) PCT No.: PCT/CN2015/086632
§ 371 (c)(1),
(2) Date: Feb. 17, 2016

(87) PCT Pub. No.: WO2016/145771
PCT Pub. Date: Sep. 22, 2016

(65) Prior Publication Data
US 2017/0047383 A1 Feb. 16, 2017

(30) Foreign Application Priority Data

Mar. 16, 2015 (CN) .......................... 2015 1 0114269

(51) Int. Cl.
*H01L 27/32* (2006.01)
*H01L 21/77* (2017.01)

(52) U.S. Cl.
CPC .......... *H01L 27/3227* (2013.01); *H01L 21/77* (2013.01); *H01L 27/322* (2013.01);
(Continued)

(58) Field of Classification Search
CPC ............... H01L 27/322; H01L 27/3227; H01L 27/3246; H01L 27/3262; H01L 27/3276
See application file for complete search history.

(56) References Cited

U.S. PATENT DOCUMENTS 8,907,928 B2 * 12/2014 Yamaguchi ......... G02F 1/13338
345/156
2007/0241998 A1 * 10/2007 Fish ..................... G09G 3/3233
345/76
(Continued)

FOREIGN PATENT DOCUMENTS

CN 1916744 A 2/2007
CN 101615624 A 12/2009
(Continued)

OTHER PUBLICATIONS

First Office Action for Chinese Application No. 201510114269.7, dated Mar. 1, 2017, 6 Pages.
(Continued)

*Primary Examiner* — Allan R Wilson
(74) *Attorney, Agent, or Firm* — Brooks Kushman P.C.

(57) ABSTRACT

The present disclosure relates to an array substrate, a method for manufacturing the array substrate and a display device. The array substrate may include a plurality of pixel groups. Each of the pixel groups may include a plurality of sub-pixels. Each of the sub-pixels may include a light-emitting region and a light-emitting layer absent region. And the light-emitting layer absent regions of the plurality of sub-pixels included in each of the pixel groups may define a first region. A photosensitive unit may be arranged on each first region and configured to generate an electrical signal based on an intensity of the light being sensed.

15 Claims, 7 Drawing Sheets

(52) U.S. Cl.
CPC ...... *H01L 27/3246* (2013.01); *H01L 27/3262* (2013.01); *H01L 27/3276* (2013.01); *H01L 2227/323* (2013.01)

(56) References Cited

U.S. PATENT DOCUMENTS

| | | | |
|---|---|---|---|
| 2009/0066867 A1 | 3/2009 | Tsubata et al. | |
| 2009/0237381 A1* | 9/2009 | Otani | G02F 1/1362 345/207 |
| 2010/0001639 A1 | 1/2010 | Kim et al. | |
| 2010/0007271 A1 | 1/2010 | Lee et al. | |
| 2012/0154354 A1 | 6/2012 | Tsujino et al. | |
| 2012/0205646 A1 | 8/2012 | Cho et al. | |
| 2012/0292621 A1 | 11/2012 | Kim et al. | |
| 2012/0313093 A1 | 12/2012 | Kim et al. | |
| 2013/0147764 A1* | 6/2013 | Chaji | H01L 27/3227 345/175 |
| 2014/0139489 A1 | 5/2014 | Hwang et al. | |
| 2014/0139490 A1 | 5/2014 | Hwang et al. | |
| 2014/0145150 A1* | 5/2014 | de Jong | H01L 27/3227 257/40 |
| 2015/0221706 A1* | 8/2015 | Udaka | H01L 27/322 257/40 |
| 2015/0249119 A1* | 9/2015 | In | H01L 27/3269 257/40 |
| 2016/0044751 A1* | 2/2016 | Ikeda | H05B 33/02 362/227 |
| 2016/0238234 A1* | 8/2016 | Diekmann | F21S 6/002 |

FOREIGN PATENT DOCUMENTS

| | | |
|---|---|---|
| CN | 101626029 A | 1/2010 |
| CN | 101751188 A | 6/2010 |
| CN | 101900899 A | 12/2010 |
| CN | 102354695 A | 2/2012 |
| CN | 102484682 A | 5/2012 |
| CN | 103838046 A | 6/2014 |
| CN | 104659072 A | 5/2015 |

OTHER PUBLICATIONS

International Search Report and Written Opinion for Application No. PCT/CN2015/086632, dated Nov. 26, 2015, 13 Pages.

* cited by examiner

ARRAY SUBSTRATE, METHOD FOR MANUFACTURING ARRAY SUBSTRATE, AND DISPLAY DEVICE

CROSS-REFERENCE TO RELATED APPLICATION

The present application is the U.S. national phase of PCT Application No. PCT/CN2015/086632 filed on Aug. 11, 2015, which claims a priority of Chinese patent application No. 201510114269.7 filed on Mar. 16, 2015, the disclosure of which is incorporated herein by reference in its entirety.

TECHNICAL FIELD

The present disclosure relates to the technical field of displaying, and in particular to an array substrate, a method for manufacturing the array substrate and a display device.

BACKGROUND

As illustrated in FIG. 1, a pixel of an active-matrix organic light emitting diode (AMOLED) display includes a plurality of Thin Film Transistors (TFTs) and a plurality of capacitors due to a characteristic of current driving of the organic light-emitting diode (OLED). FIG. 2 illustrates the arrangement of such pixels. However, a design of a pixel circuit has to be improved due to an increasing demand on the display performance, which is a challenge in the industry. As illustrated in FIG. 3, for example in the related art, a via hole for overlapping and connecting a cathode and an anode is filled with a pixel definition layer, so as to improve the overlapping of the cathode and the anode through the via hole and prevent from a risk of short circuiting caused by metal climbing in the via hole. However, such arrangement may reduce an aperture ratio, as illustrated in FIG. 4.

Furthermore, as illustrated in FIG. 5, the capacitor may be of a smaller capacity due to an increment of pixels per inch (PPI). As illustrated in FIG. 6, in the related art, it is arranged the metal3 which is a metal material not belonging to a gate electrode metal layer or a source-drain electrode metal layer for increasing the capacity of the capacitor. However the aperture ratio is still reduced in such arrangement.

In other words, the aperture ratio has to be reduced due to the improvement of the pixels.

SUMMARY

(1) Technical Problems to be Solved

In the present disclosure, an object of the present disclosure is to efficiently utilize a region around the via hole in a condition that the area for the aperture is reduced due to the via hole in the display (namely the aperture ratio is reduced).

(2) Technical Solutions

For the above object, the present disclosure provides an array substrate, including: a plurality of pixel groups, wherein each of the pixel groups includes a plurality of sub-pixels, each of the sub-pixels includes a light-emitting region and a light-emitting layer absent region, and the light-emitting layer absent regions of the plurality of sub-pixels in each of the pixel groups define a first region; and wherein a photosensitive unit is arranged on each first region and configured to generate an electrical signal based on an intensity of the light being sensed.

Alternatively, a driving transistor may be arranged on the light-emitting region, a pixel definition layer may be formed on the light-emitting layer absent region, and beneath the pixel definition layer, a first electrode of each sub-pixel may be electrically connected to a source electrode or a drain electrode of the driving transistor of the sub-pixel through a via hole.

Alternatively, the photosensitive unit may include:

a photosensitive transistor, wherein a photosensitive active layer of the photosensitive transistor is arranged on a planarization layer, at least a portion of a channel region of the photosensitive active layer is not covered by the pixel definition layer, both a source electrode and a drain electrode of the photosensitive transistor are arranged on the planarization layer and beneath two ends of the photosensitive active layer respectively, and a gate electrode of the photosensitive transistor is arranged between a passivation layer and the planarization layer.

Alternatively, the source electrode and the drain electrode of the photosensitive transistor as well as the first electrodes of the sub-pixels may be arranged on a same layer.

Alternatively, the photosensitive unit may further include:

a reading transistor, wherein an active layer of the reading transistor is arranged on the planarization layer, both a source electrode and a drain electrode of the reading transistor are arranged on the planarization layer and beneath the active layer of the reading transistor, and a gate electrode of the reading transistor is arranged between the passivation layer and the planarization layer.

Alternatively, the photosensitive unit may further include: a photosensitive unit driving line arranged on the passivation layer; and a photosensitive unit signal reading line arranged on the planarization layer.

The present disclosure further provides a display device including the above array substrate according to any one of the above embodiments.

Alternatively, the display device may further include:

a color filter substrate, wherein a black matrix is arranged on the color filter substrate and at an area corresponding to the photosensitive unit, and a notch is arranged in the black matrix and at a position corresponding to the photosensitive active layer of the photosensitive transistor of the photosensitive unit.

The present disclosure further provides a method for manufacturing an array substrate, including steps of:

forming driving transistors of predetermined sub-pixels; and forming a photosensitive unit on a first region defined by respective predetermined light-emitting layer absent regions of a plurality of predetermined sub-pixels included in one pixel group, wherein the photosensitive unit is configured to generate an electrical signal based on an intensity of the light being sensed.

Alternatively, the step of forming the photosensitive unit may include steps of:

forming a gate electrode of the photosensitive transistor on a passivation layer:

forming a planarization layer;

forming a source electrode and a drain electrode of the photosensitive transistor on the planarization layer;

forming a photosensitive active layer on the source electrode and the drain electrode; and forming a pixel definition layer, wherein at least a portion of a channel region of the photosensitive active layer is not covered by the pixel definition layer.

Alternatively, the step of forming the photosensitive unit may further include steps of:

forming a gate electrode of a reading transistor on the passivation layer while forming the gate electrode of the photosensitive transistor; and forming a source electrode and a drain electrode of the reading transistor on the planarization layer while forming the source electrode and the drain electrode of the photosensitive transistor.

Alternatively, the method may further include steps of:

forming first electrodes of the sub-pixels on the planarization layer while forming the source electrode and the drain electrode of the photosensitive transistor.

Alternatively, the method may further include steps of:

filling a source electrode-drain electrode via hole in the passivation layer with a metal material while forming the gate electrode of the photosensitive transistor.

Alternatively, the method may further include steps of:

forming a photosensitive unit driving line on the passivation layer while forming the gate electrode of the photosensitive transistor; and forming a signal reading line on the planarization layer while forming the source electrode and the drain electrode of the photosensitive transistor.

(3) Advantageous Effects

The embodiments of the present disclosure at least achieve the following advantageous effects:

in the above technical solutions, the non-light-emitting regions (i.e. the light-emitting layer absent regions) of the sub-pixels may be sufficiently utilized by arranging the photosensitive unit in the non-light-emitting regions of the sub-pixels, and thus the absent aperture areas in the sub-pixels are efficiently compensated. As a result, the circuits in the array substrate are made to be more compact and efficient, while a function of positioning by sensing the light can be also achieved.

BRIEF DESCRIPTION OF THE DRAWINGS

In order to illustrate the technical solutions of the present disclosure or the related art in a clearer manner, the drawings desired for the embodiments will be described briefly hereinafter. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, some technical solutions of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure will be further described hereinafter in conjunction with the drawings and embodiments. The following embodiments are for illustrative purposes, but shall not be used to limit the scope of the present disclosure.

Figure 1:
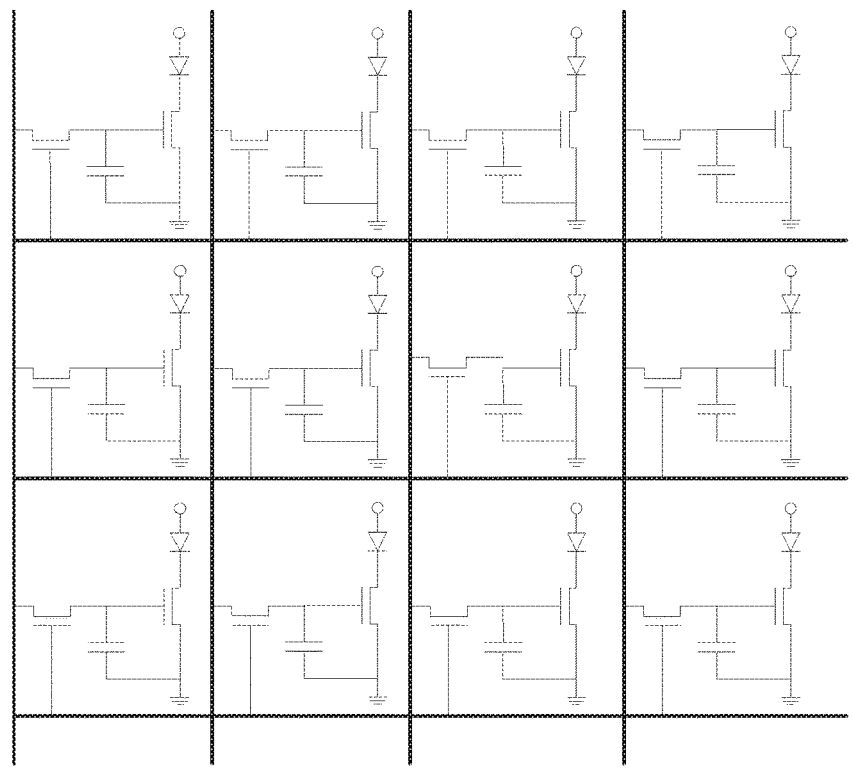
FIGS. 1-6 illustrate causes of an aperture ratio being reduced in a pixel arrangement according to the related art.
Figure 2:
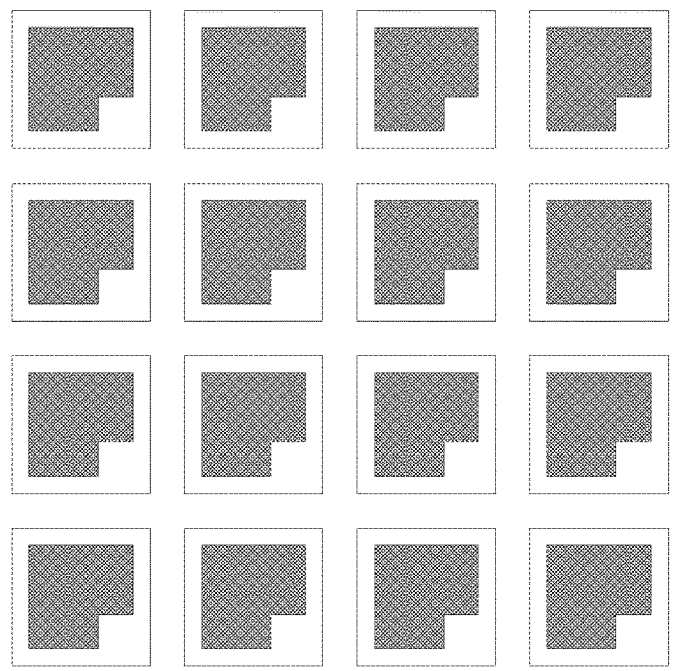
Figure 3:
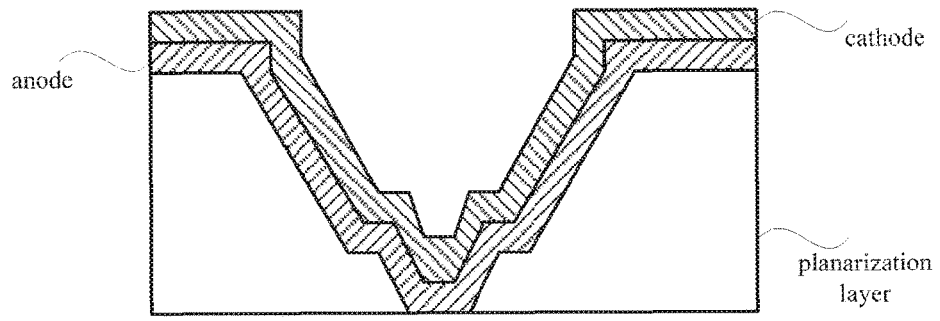
Figure 4:
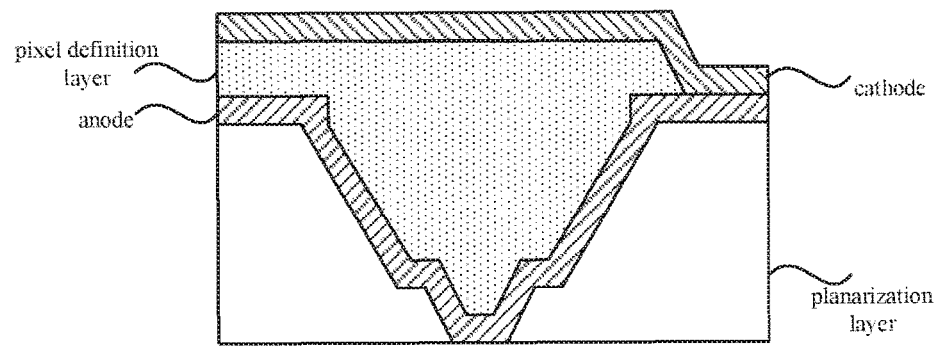
Figure 5:
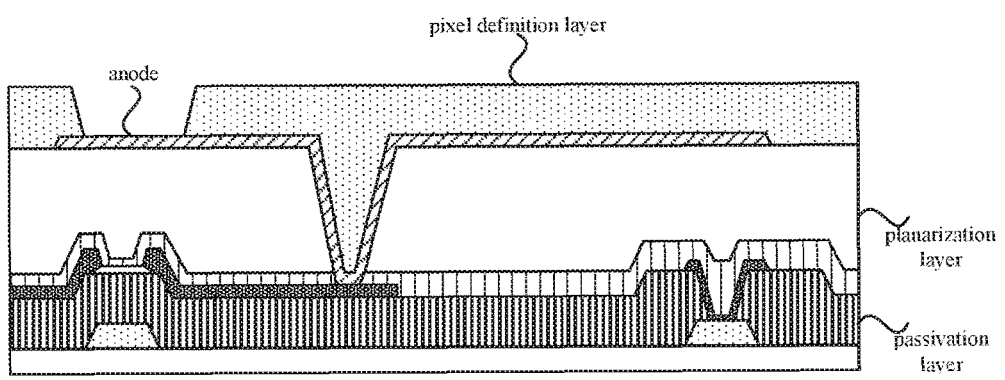
Figure 6:
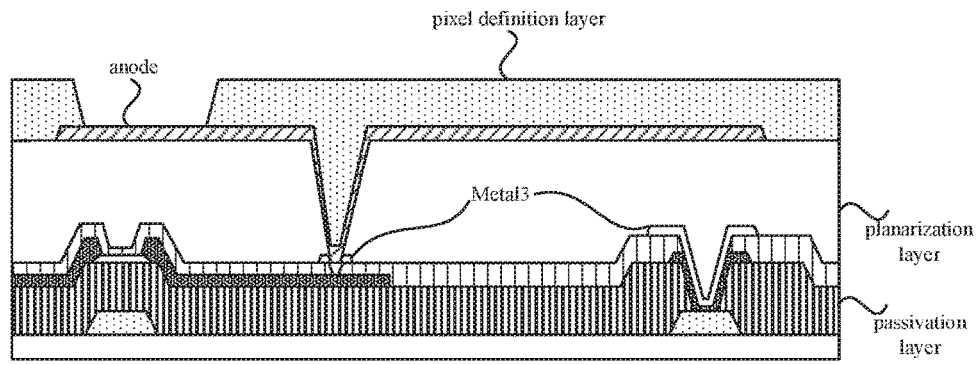
Figure 7:
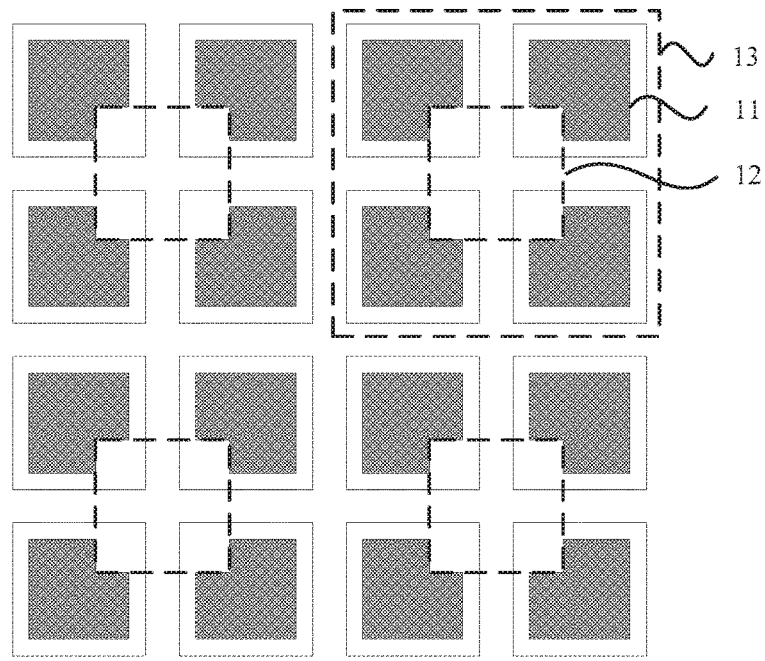
FIG. 7 illustrates a pixel arrangement according to an embodiment of the present disclosure.

As illustrated in FIG. 7, in an embodiment of the present disclosure, it is provided an array substrate, including: a plurality of pixel groups 13, wherein each of the pixel groups 13 includes a plurality of sub-pixels 11, each of the sub-pixels 11 includes a light-emitting region and a light-emitting layer absent region, and the light-emitting layer absent regions of the plurality of sub-pixels 11 in each of the pixel groups 13 define a first region 12.

It is appreciated that, in the present disclosure, each pixel group including four sub-pixels is merely an example. As a matter of fact, each pixel group may include any other number of sub-pixels, as long as the first region may be defined by the light-emitting layer absent regions of all the sub-pixels in the pixel group. Furthermore, the pixel group is not equivalent to a pixel. The sub-pixels of each pixel group may be provided by one pixel or a plurality of different pixels. In addition, the first region is of a square shape as shown in FIG. 7. However, the first region may be of any other shape, as long as the photosensitive unit may be arranged on the first region.

The photosensitive unit is arranged on each first region and configured to generate an electrical signal based on an intensity of the light being sensed.

The light-emitting layer absent regions of the sub-pixels in the pixel group correspond to the area of the via hole in the pixel arrangement. In addition to the light-emitting layer absent regions of the sub-pixels in the pixel group, the first region may further include a region among the sub-pixels on which no pixel circuit (including the driving transistor as well as the corresponding data line and gate electrode line) is arranged.

The non-light-emitting regions (i.e. the light-emitting layer absent regions) of the sub-pixels may be sufficiently utilized by arranging the photosensitive unit in the first region, and thus the absent aperture areas in the sub-pixels are efficiently compensated. As a result, the circuits in the array substrate are made to be more compact and efficient, while a function of positioning by sensing the light can be achieved.

Figure 8:
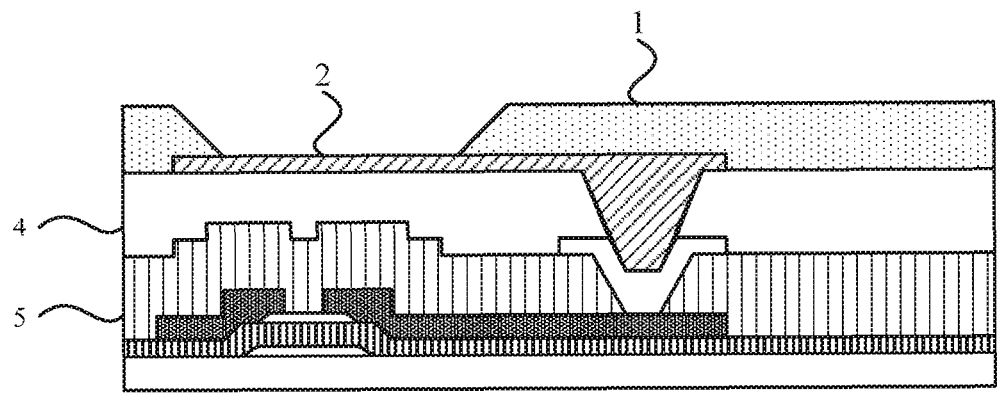
FIG. 8 illustrates a driving transistor according to an embodiment of the present disclosure.

Alternatively, as illustrated in FIG. 8, the driving transistor is arranged on the light-emitting region, and the pixel definition layer 1 is arranged on the light-emitting layer absent region. Beneath the pixel definition layer, a first electrode 2 of each sub-pixel 11 is electrically connected to a source electrode or a drain electrode of the driving transistor of the sub-pixel 11 through a via hole.

The arrangement of the photosensitive unit may not affect the structure of the via hole in the transistor, because the photosensitive unit is generally arranged on the neighboring light-emitting layer absent regions of every four transistors. The first electrode 2 is generally an anode of the OLED. Alternatively, the first may be a cathode of the OLED when the OLED is an inverted OLED.

In particular, the first electrode 2 may be overlapped and connected with the source electrode or the drain electrode of the driving transistor by the metal material, and the metal material may be contained in a via hole formed in the planarization layer 4. The metal material may be extended on the passivation layer 5 by a certain process, so that the extension of the metal may be overlapped and connected with the source electrode or the drain electrode to form a capacitor because the passivation layer 5 is generally an insulation layer. As a result, the capacitance density of the pixel is increased.

Figure 9:
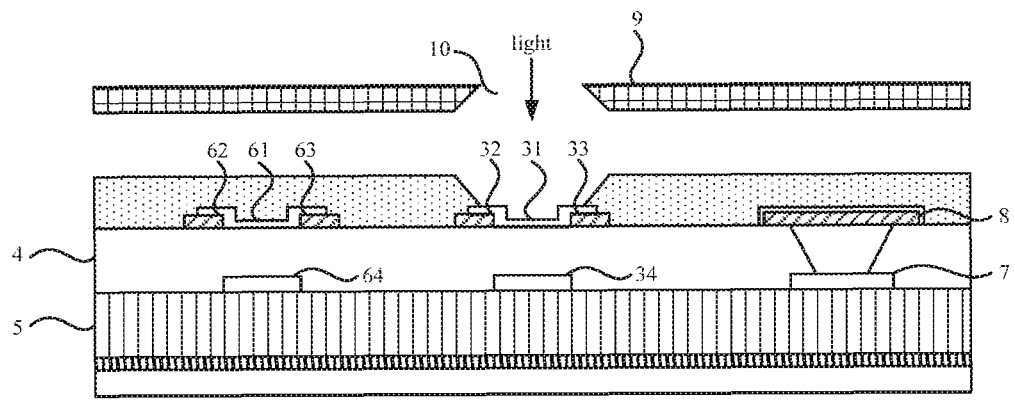
FIG. 9 illustrates a photosensitive unit according to an embodiment of the present disclosure.

Alternatively, as illustrated in FIG. 9, the photosensitive unit includes:

a photosensitive transistor 3, wherein a photosensitive active layer 31 of the photosensitive transistor 3 is arranged on a planarization layer 4, at least a portion of a channel region of the photosensitive active layer 31 is not covered by the pixel definition layer 1, both a source electrode 32 and a drain electrode 33 of the photosensitive transistor 3 are arranged on the planarization layer 4 and beneath two ends of the photosensitive active layer 31 respectively, and a gate electrode 34 of the photosensitive transistor 3 is arranged between a passivation layer 4 and the planarization layer 5.

Alternatively, the source electrode 32 and the drain electrode 33 of the photosensitive transistor 3 as well as the first electrodes 2 of the sub-pixels are arranged on a same layer. The source electrode 32 and the drain electrode 33 of the photosensitive transistor 3 as well as the first electrodes 2 of the sub-pixels may be formed by one photo-etching process because these electrodes are formed on the same layer, so that the manufacturing process is simplified.

Alternatively, the photosensitive unit further includes:

a reading transistor 6, wherein an active layer 61 of the reading transistor 6 is arranged on the planarization layer 4, both a source electrode 62 and a drain electrode 63 of the reading transistor 6 are arranged on the planarization layer 4 and beneath the active layer 61 of the reading transistor 6, and a gate electrode 64 of the reading transistor 6 is arranged between the passivation layer 4 and the planarization layer 5.

Alternatively, the photosensitive unit further includes: a photosensitive unit driving line 7 arranged on the passivation layer 5; and a photosensitive unit signal reading line 8 arranged on the planarization layer 4.

Figure 10:
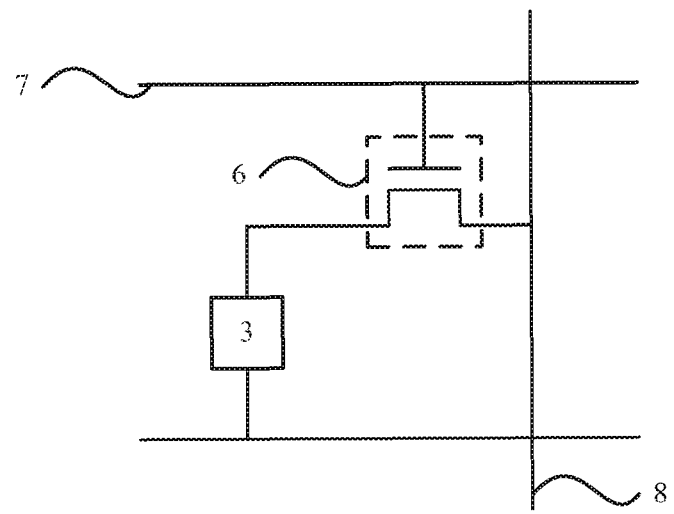
FIG. 10 illustrates a circuit of the photosensitive unit according to an embodiment of the present disclosure.

FIG. 10 illustrates a circuit of the photosensitive unit. Both the photosensitive active layer 31 and the gate electrode 34 of the photosensitive transistor are made of a photosensitive material. The photosensitive transistor 3 may generate an induced current by sensing a variation of the light from the outside, and the induced current is transmitted to a corresponding processor by the reading transistor 6 for calculating, so as to determine a position where the light is varied, and thus the positioning by sensing the light can be achieved.

The reading transistor 6 may be turned ON or OFF by different signals transmitted by the photosensitive unit driving line 7. The induced current generated by the photosensitive transistor 3 may be transmitted to the processor (not shown) only if the reading transistor 6 is in a state of being turned ON.

It is appreciated that the photosensitive element 3 as illustrated in FIG. 9 is a transistor. However, the photosensitive element 3 may be arranged to be a diode if necessary. In particular, the photosensitive element 3 may be arranged to be the transistor if high positioning precision is required: in contrast, the photosensitive element 3 may be arranged to be the diode if low positioning precision is required and the manufacturing process is simplified.

Figure 11:
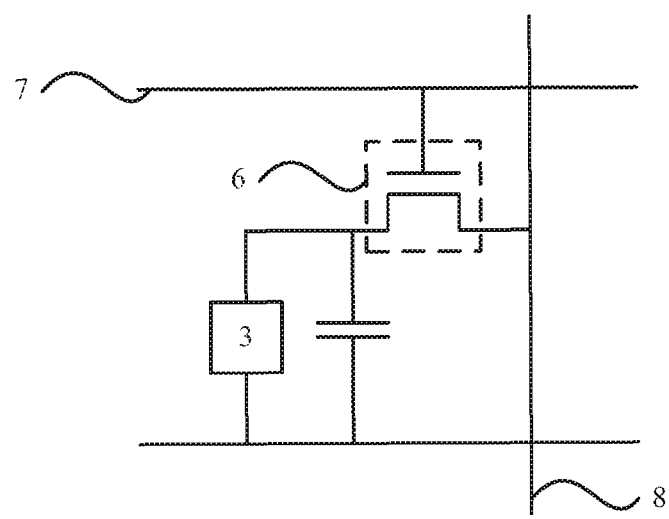
FIG. 11 illustrates a circuit of the photosensitive unit according to another embodiment of the present disclosure.

Furthermore, the circuit of the photosensitive unit may be configured based on the demand. As illustrated in FIG. 11, an additional capacitor may be arranged in the photosensitive unit to increase the capacitance density of the pixels.

The present disclosure further provides a display device including the above array substrate according to any one of the above embodiments. It is appreciated that, in the embodiments of the present disclosure, the display device may include an electronic paper, a mobile phone, a tablet computer, a television, a notebook computer, a digital picture frame, a navigation system or any other product or part having a display function.

Figure 12:
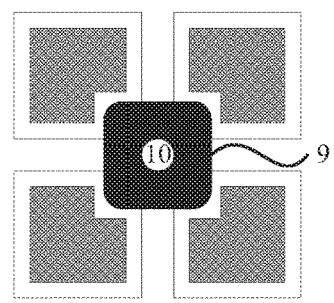
FIG. 12 illustrates a black matrix according to an embodiment of the present disclosure.

Alternatively, as illustrated in FIG. 12, the display device further includes:

a color filter substrate, wherein a black matrix 9 is arranged on the color filter substrate and at an area corresponding to the photosensitive unit, and a notch 10 is arranged in the black matrix 9 and at a position corresponding to the photosensitive active layer 31 of the photosensitive transistor 3 of the photosensitive unit.

The light is transmitted through the notch 10. When the light being transmitted varies (for example, the light may appear from being not existed or disappear from being existed, or the intensity of the light may become stronger or weaker), the induced current generated by the photosensitive unit varies accordingly. The corresponding processor may determine the photosensitive unit in which the induced current varies, so as to determine coordinates of the photosensitive unit on the display panel. As a result, the positioning by sensing the light can be achieved.

Figure 13:
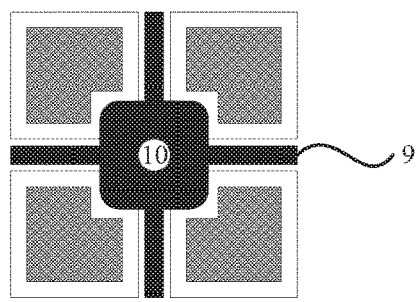
FIG. 13 illustrates a black matrix according to another embodiment of the present disclosure.

In particular, the black matrix may be arranged merely in the first region, or may be arranged in a neighboring region between every two sub-pixels as illustrated in FIG. 13. Thus the shading area is increased, and the photosensitive transistor is prevented from making wrong determination caused by receiving light from another location.

The present disclosure further provides a method for manufacturing an array substrate, including steps of:

forming driving transistors of predetermined sub-pixels; and forming a photosensitive unit on a first region defined by respective predetermined light-emitting layer absent regions of a plurality of predetermined sub-pixels included in one pixel group, wherein the photosensitive unit is configured to generate an electrical signal based on an intensity variation of the light being sensed.

Figure 14:
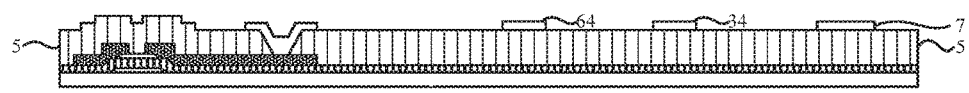
FIGS. 14-18 illustrate a method for manufacturing the array substrate according to an embodiment of the present disclosure.
Figure 15:
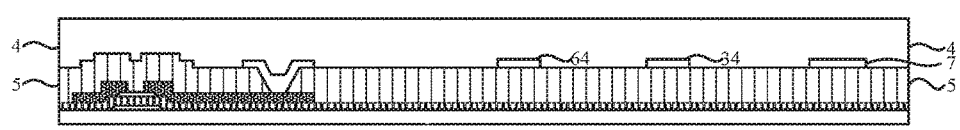
Figure 16:
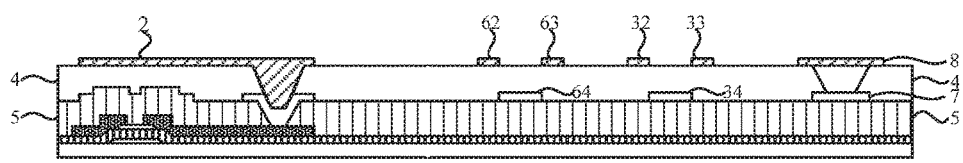
Figure 17:
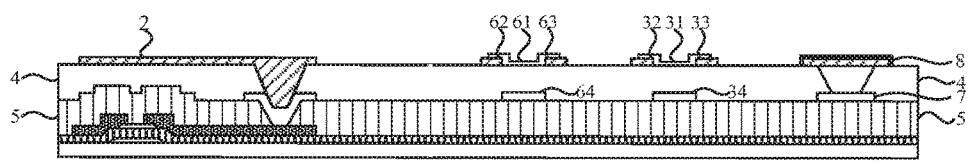
Figure 18:
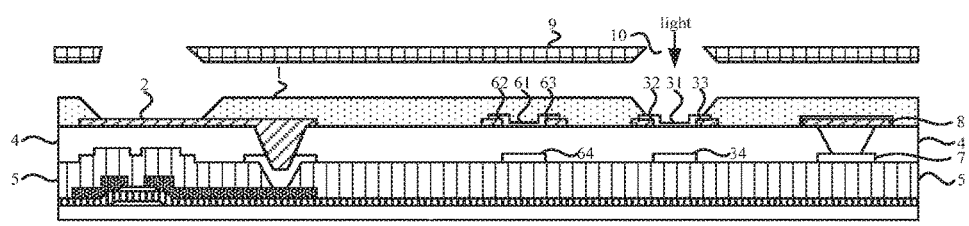

Alternatively, the step of forming the photosensitive unit includes steps of:

forming a gate electrode 34 of the photosensitive transistor 3 on a passivation layer 5 which may be implemented by the metal3, as illustrated in FIG. 14;

forming a planarization layer 4, as illustrated in FIG. 15;

forming a source electrode 32 and a drain electrode 33 of the photosensitive transistor 3 on the planarization layer 4, as illustrated in FIG. 16;

forming a photosensitive active layer 31 on the source electrode 32 and the drain electrode 33, as illustrated in FIG. 17; and forming a pixel definition layer 1, wherein at least a portion of a channel region of the photosensitive active layer 31 is not covered by the pixel definition layer 1, as illustrated in FIG. 18.

Alternatively, the step of forming the photosensitive unit further includes steps of:

forming a gate electrode 64 of a reading transistor 6 on the passivation layer 5 while forming the gate electrode 34 of the photosensitive transistor 3; and forming a source electrode 62 and a drain electrode 63 of the reading transistor 6 on the planarization layer 5 while forming the source electrode 32 and the drain electrode 33 of the photosensitive transistor 3.

Alternatively, the method further includes steps of:

forming first electrodes of the sub-pixels on the planarization layer 4 while forming the source electrode 32 and the drain electrode 33 of the photosensitive transistor.

The first electrode may be an anode of the OLED. When the OLED is a top-emitting OLED, the first electrode may be made of a same metal material of the source electrode 32 and drain electrode 33, so that the first electrode functions both as the anode and to reflect a portion of the light emitted downwardly by the OLED, and thus the aperture ratio of the OLED is improved. Furthermore, the first electrode, the source electrode 32 and the drain electrode 33 may be formed by one process, so that the manufacturing process is simplified.

When the OLED is a bottom-emitting OLED, the light is emitted downwardly by transmitting the first electrode, and thus the first electrode should be transparent. As a result, the first electrode may be made of transparent metallic oxide, such as indium tin oxide (ITO), indium zinc oxide (IZO), and so forth.

Alternatively, the method further includes steps of:

filling a source-drain electrode via hole in the passivation layer 5 with a metal material while forming the gate electrode 34 of the photosensitive transistor 3, which may be implemented by the metal3.

Alternatively, the method further includes steps of:

forming a photosensitive unit driving line 7 on the passivation layer 5 while forming the gate electrode 34 of the photosensitive transistor 3; and forming a signal reading line 8 on the planarization layer 4 while forming the source electrode 32 and the drain electrode 33 of the photosensitive transistor 3.

The layer arrangement in the photosensitive unit and the layer arrangement in the driving transistor may be formed by one photo-etching process to reduce the number of processes and simplify the manufacturing process.

The technical solutions of the present disclosure have been described in association with the drawings, so as to compensate for the aperture ratio being reduced due to the improvement of the pixels in the related art. In the technical solutions of the present disclosure, the non-light-emitting regions of the sub-pixels may be sufficiently utilized by arranging the photosensitive unit in the non-light-emitting regions of the sub-pixels, and thus the absent aperture areas in the sub-pixels are efficiently compensated. As a result, the circuits in the array substrate are made to be more compact and efficient, while a function of positioning by sensing the light can be achieved.

It is appreciated that, some layers or portions in the figure may be enlarged in size for clarity. It should be noted that, when an element or a layer is called to be "on" another element or layer, it may directly contact the other element or layer, or more than one intermediate layer may be arranged therebetween. Furthermore, it should be noted that, when an element or a layer is called to be "beneath" another element or layer, it may directly contact the other element or layer, or more than one intermediate element or layer may be arranged therebetween. Furthermore, it should be noted that, when the layer or element is called to be "between" two layers or two elements, it may be the only layer or element between the two layers or the two elements, or more than one intermediate layer or element may be arranged therebetween. Similar reference signs indicate similar elements throughout the description.

In the present disclosure, the term "first" is adopted for distinguishing purposes only, but should be understood not to indicate or imply the relative importance. Unless otherwise explicitly indicated, the term "plurality of" means two or more than two.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. An array substrate, comprising:
   a plurality of pixel groups,
   wherein each of the pixel groups comprises a plurality of sub-pixels, each of the sub-pixels comprises a light-emitting region and a light-emitting layer absent region, light is not generated in the light-emitting layer absent region, and the light-emitting layer absent regions of the plurality of sub-pixels in each of the pixel groups define a first region;
   wherein a photosensitive unit is arranged on each first region, configured to generate an electrical signal based on an intensity of sensed external light, and comprises a photosensitive transistor; and
   wherein a driving transistor is arranged on the light-emitting region, a pixel definition layer is formed on the light-emitting layer absent region, and beneath the pixel definition layer, a first electrode of each sub-pixel is electrically connected to a source electrode or a drain electrode of the driving transistor of the sub-pixel through a via hole, and the first electrode of each sub-pixel is on a same layer as a source electrode and a drain electrode of the photosensitive transistor.

2. The array substrate according to claim 1, wherein a photosensitive active layer of the photosensitive transistor is arranged on a planarization layer, at least a portion of a channel region of the photosensitive active layer is not covered by the pixel definition layer, both the source electrode and the drain electrode of the photosensitive transistor are arranged on the planarization layer and beneath two ends of the photosensitive active layer respectively, and a gate electrode of the photosensitive transistor is arranged between a passivation layer and the planarization layer.

3. The array substrate according to claim 2, wherein the photosensitive unit further comprises: a reading transistor, wherein an active layer of the reading transistor is arranged on the planarization layer, both a source electrode and a drain electrode of the reading transistor are arranged on the planarization layer and beneath the active layer of the reading transistor, and a gate electrode of the reading transistor is arranged between the passivation layer and the planarization layer.

4. The array substrate according to claim 2, wherein the photosensitive unit further comprises: a photosensitive unit driving line arranged on the passivation layer; and a photosensitive unit signal reading line arranged on the planarization layer.

5. The array substrate according to claim 1, wherein the light-emitting layer absent regions are non-light-emitting regions within respective sub-pixels.

6. A display device comprising an array substrate, wherein the array substrate comprises a plurality of pixel groups,
wherein each of the pixel groups comprises a plurality of sub-pixels, each of the sub-pixels comprises a light-emitting region and a light-emitting layer absent region, light is not generated in the light-emitting layer absent region, and the light-emitting layer absent regions of the plurality of sub-pixels in each of the pixel groups define a first region;
wherein a photosensitive unit is arranged on each first region, configured to generate an electrical signal based on an intensity of sensed external light, and comprises a photosensitive transistor; and
wherein a driving transistor is arranged on the light-emitting region, a pixel definition layer is formed on the light-emitting layer absent region, and beneath the pixel definition layer, a first electrode of each sub-pixel is electrically connected to a source electrode or a drain electrode of the driving transistor of the sub-pixel through a via hole, and the first electrode of each sub-pixel is on a same layer as a source electrode and a drain electrode of the photosensitive transistor.

7. The display device according to claim 6, further comprising: a color filter substrate,
wherein a black matrix is arranged on the color filter substrate and at an area corresponding to the photosensitive unit, and a notch is arranged in the black matrix and at a position corresponding to a photosensitive active layer of a photosensitive transistor of the photosensitive unit.

8. The display device according to claim 6,
wherein a photosensitive active layer of the photosensitive transistor is arranged on a planarization layer, at least a portion of a channel region of the photosensitive active layer is not covered by the pixel definition layer, both the source electrode and the drain electrode of the photosensitive transistor are arranged on the planarization layer and beneath two ends of the photosensitive active layer respectively, and a gate electrode of the photosensitive transistor is arranged between a passivation layer and the planarization layer.

9. The display device according to claim 8, wherein the photosensitive unit further comprises: a reading transistor, wherein an active layer of the reading transistor is arranged on the planarization layer, both a source electrode and a drain electrode of the reading transistor are arranged on the planarization layer and beneath the active layer of the reading transistor, and a gate electrode of the reading transistor is arranged between the passivation layer and the planarization layer.

10. The display device according to claim 8, wherein the photosensitive unit further comprises: a photosensitive unit driving line arranged on the passivation layer; and a photosensitive unit signal reading line arranged on the planarization layer.

11. A method for manufacturing an array substrate, comprising steps of:
forming driving transistors of predetermined sub-pixels; and
forming a photosensitive unit on a first region defined by respective predetermined light-emitting layer absent regions of a plurality of predetermined sub-pixels included in one pixel group, wherein the photosensitive unit is configured to generate an electrical signal based on an intensity of sensed external light, and light is not generated in the light-emitting layer absent regions,
wherein the step of forming the photosensitive unit comprises steps of:
forming a gate electrode of a photosensitive transistor on a passivation layer;
forming a planarization layer;
forming a source electrode and a drain electrode of the photosensitive transistor on the planarization layer;
forming a photosensitive active layer on the source electrode and the drain electrode; and
forming a pixel definition layer, wherein at least a portion of a channel region of the photosensitive active layer is not covered by the pixel definition layer.

12. The method according to claim 11, wherein the step of forming the photosensitive unit comprises steps of:
forming a gate electrode of a reading transistor on the passivation layer while forming the gate electrode of the photosensitive transistor; and
forming a source electrode and a drain electrode of the reading transistor on the planarization layer while forming the source electrode and the drain electrode of the photosensitive transistor.

13. The method according to claim 11, further comprising a step of:
forming first electrodes of the sub-pixels on the planarization layer while forming the source electrode and the drain electrode of the photosensitive transistor.

14. The method according to claim 11, further comprising a step of:
filling a source-drain electrode via hole in the passivation layer with a metal material while forming the gate electrode of the photosensitive transistor.

15. The method according to claim 11, further comprising steps of:
forming a photosensitive unit driving line on the passivation layer while forming the gate electrode of the photosensitive transistor; and
forming a signal reading line on the planarization layer while forming the source electrode and the drain electrode of the photosensitive transistor.

* * * * *